(12) United States Patent
Kottmair et al.

(10) Patent No.: US 6,506,533 B1
(45) Date of Patent: Jan. 14, 2003

(54) POLYMERS AND THEIR USE IN IMAGABLE PRODUCTS AND IMAGE-FORMING METHODS

(75) Inventors: Eduard Kottmair, Ebenhausen (DE); Hans-Horst Glatt, Munich (DE); Stefan Hilgart, Munich (DE); Paul West, Ft. Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 38 days.

(21) Appl. No.: 09/589,333

(22) Filed: Jun. 7, 2000

(51) Int. Cl.$^7$ ................................................. G03F 7/023
(52) U.S. Cl. .................... 430/190; 430/270.1; 430/302; 525/227; 525/330.5; 525/256; 525/259; 525/359.2
(58) Field of Search ................................. 430/190, 346, 430/270.1, 302; 525/504, 502, 219, 227, 256, 259, 303, 308, 330.5, 333.6, 359.2

(56) References Cited

U.S. PATENT DOCUMENTS

| | | | |
|---|---|---|---|
| 4,619,990 A | 10/1986 | Elmasry | 534/573 |
| 4,680,375 A | 7/1987 | Elmasry | 528/253 |
| 4,948,843 A | * 8/1990 | Roberts et al. | 525/328.2 |
| 4,950,587 A | * 8/1990 | Roberts et al. | 430/570 |
| 6,063,544 A | 5/2000 | Sheriff et al. | 430/271.1 |
| 6,124,425 A | 9/2000 | Nguyen | 528/422 |

FOREIGN PATENT DOCUMENTS

| | | |
|---|---|---|
| EP | 825927 | 3/1998 |
| EP | 864419 | 9/1998 |
| GB | 1245924 | 9/1971 |
| WO | WO9901795 | 1/1999 |
| WO | WO9901796 | 1/1999 |
| WO | 9908879 | 2/1999 |

OTHER PUBLICATIONS

Reactive Azo Dyes in "Color Chemistry", H. Zollinger, 2$^{nd}$ Edition, pp. 167–169, VCH Verlag Weinheim, New York 1991.
L. Strekowski, M. Lipowska, G. Patonay, J. Org. Chem., 1992, 57, pp. 4578–4580.
Y.L. Slaminski, I.D. Radchenko, A.I. Tolmachev, J. Org. Chem. USSR, 1979, 15, pp. 351–356.

* cited by examiner

Primary Examiner—John S. Chu
(74) Attorney, Agent, or Firm—Faegre & Benson, LLP

(57) ABSTRACT

Infra-red absorbing polymers useful in imageable products and the lithographic printing field comprise infra-red absorbing groups carried as pendent groups on a polymer backbone. Certain infra-red absorbing groups may also act to insolublize the polymer in a developer, until it is imagewise exposed to infra-red radiation. The resulting heat renders the polymer soluble in the developer. Imagable products employing the infra-red absorbing polymers may include positive working lithographic printing plates.

24 Claims, No Drawings

POLYMERS AND THEIR USE IN IMAGABLE PRODUCTS AND IMAGE-FORMING METHODS

BACKGROUND OF THE INVENTION

1. Field of the Invention

The invention relates to novel polymers and to their use in imagable products. The invention relates further to the synthesis of the novel polymers.

Imagable products of particular interest in the context of this invention are lithographic printing form precursors i.e. coated printing forms (or plates) prior to exposure and development). The background to the invention will be described with reference to the lithographic printing field, from which this invention derived, but it is to be understood that the invention is not limited to this field. The novel polymers may find application in the lithographic printing field and in other fields.

2. Background Information

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water while the image area accepts ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

A generally used type of lithographic printing form precursor has a radiation sensitive coating applied to an aluminum substrate. Negative working lithographic printing form precursors have a radiation sensitive coating which when imagewise exposed to radiation of a suitable wavelength hardens in the exposed areas. On development, the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a radiation source; conventionally this has been a UV radiation source. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed on development.

Many positive working systems rely on the inhibition of the inherent solubility of phenolic resins, in suitable developers. Traditionally this has been achieved through the use of diazide moieties, especially naphthoquinone diazide (NQD) moieties, to provide compositions which only following exposure to UV radiation are soluble in the developer.

As demands on the performance of UV-sensitive positive working coatings have increased, so NQD technology has become limiting. In addition, digital and laser imaging technology is making new demands on coatings for lithographic printing.

It is known from G.B. 1245924 that the solubility of phenolic resins in lithographic developers may be increased by the application of heat. The heat may be delivered by infra-red radiation, assisted by radiation absorbing components such as carbon black or Milori Blue (C.I. Pigment Blue 27). However the developer resistance of the non-exposed areas to commercial developers is low, and the solubility differential is low compared to the commercial UV sensitive compositions containing NQD moieties.

Additional positive working heat sensitive systems have been developed to meet the new demands. Such systems and methods are disclosed, for example, in EP 825927B, WO 99/01795 and WO 99/01796.

EP 825927B describes commercially-successful positive working thermal printing form technology. Imagable coatings disclosed in EP 825927B comprise a polymeric substance, an infra-red absorbing compound and a compound which acts to inhibit the polymeric substance from dissolving in a developer liquid. The infra-red absorbing compound may be admixed within the coating, or may form a separate layer within the coating. Where heated, the inhibition effect is lost and the polymeric substance is able to dissolve in the developer liquid. Infra-red radiation is used for imaging. In imaged areas the infra-red absorbing compound absorbs the radiation and generates the required heat. EP 825927B discloses that certain compounds may be infra-red absorbing compounds and also have the reversible dissolution effect. However the most effective examples use two separate compounds to perform these functions.

WO 99/01796 discloses that imagable lithographic coatings composed of a polymeric substance and diazide moieties, such as naphthoquinone diazide (NQD) moieties—previously used in traditional ultra-violet exposure methods—may be insolubilized by heat. Again, it is disclosed that the heat may be delivered by infra-red radiation, acting on an infra-red absorbing compound admixed within the coating, or forming a separate layer within the coating.

WO 99/01795 discloses imagable lithographic coatings comprising an infra-red absorbing compound—once again admixed or in a separate layer—and a polymeric substance modified to carry functional groups which act to inhibit the dissolution of the modified polymeric substance in a developer liquid, compared with the corresponding unmodified polymeric substance.

The technology described above has been successful, but the need for a plurality of compounds has some implications for manufacturing and storage. Errors may occur in manufacturing, leading to products which are not optimal, or which are not wholly consistent, from batch to batch. After manufacture, there is a possibility that migration of separate components, for example the infra-red absorbing compounds, can occur.

SUMMARY OF THE INVENTION

The polymer of this invention has at least one pendent infra-red absorbing group, and the polymer initially does not dissolve in a developer liquid. However, when the polymer is subjected to infra-red radiation, the polymer dissolves in the developer liquid. In one preferred embodiment, the polymer has functional groups independently selected from —SONHR, —NHR, —SH and —OH, where R is H or a $C_1$–$C_4$ alkyl group, and the polymer additionally has pendent groups which absorb infra-red radiation, such as polymethine dye and cyanine dye residues. The polymer may be prepared by reacting a parent polymer with an infra-red absorbing compound.

The thermally imageable composition of this invention comprises the above-described polymer, such that when the composition is applied as a dry coating to a substrate, the composition initially does not dissolve in a developer liquid, but upon exposure of regions of the coating to infra-red radiation, the coating dissolves in the developer liquid. The lithographic printing form precursor of this invention comprises a substrate having the above-described coating applied thereon.

The lithographic printing form of this invention is prepared by a method which comprises: (a) providing the above-described precursor; (b) imagewise exposing areas of the thermally imageable composition applied to the substrate via infra-red radiation; and (c) contacting the precursor with a developer liquid to remove the exposed areas of the composition.

DETAILED DESCRIPTION OF THE INVENTION

It has been found that a polymer may be manufactured which itself has the means to absorb infra-red radiation, to generate the heat required to alter its solubility in a developer liquid. It has been determined that such a polymer may have some useful further properties which could not have been predicted.

In accordance with a first embodiment of this invention there is provided a polymer which has pendent infra-red absorbing groups, the polymer having the property that it does not dissolve in a developer liquid, with the proviso that when subjected to infra-red radiation which is absorbed by the infra-red absorbing groups to produce heat, the polymer dissolves in the developer liquid. Such a polymer of the invention is referred to herein as an "infra-red absorbing polymer."

The functional groups which insolubilize the infra-red absorbing polymer may include pendent functional groups carried by the polymer, additional to the infra-red absorbing groups. Suitable functional groups include those described in WO 99/01795, the contents of which are hereby incorporated in this specification by reference. Preferred groups are —O—SO$_2$—tolyl, —O—dansyl, —O—SO$_2$—thienyl, —O—SO$_2$—naphthyl and —O—CO—Ph.

Alternatively or additionally diazide functional groups may be carried by the polymer. When diazide groups are used in this invention, either in separate compounds admixed with the infra-red absorbing polymer or as functional groups on the infra-red absorbing polymer, as described above, they preferably comprise diazo groups (=N$_2$), preferably conjugated to carbonyl groups, preferably via an aromatic or heteroaromatic ring.

In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-naphthoquinonediazide (NQD) moieties.

A BQD moiety may, for example, comprise the 1,4- or, preferably 1,2-benzoquinonediazide moiety. An NQD moiety may, for example comprise the 1,4-, 2,1- or, most preferably, the 1,2-naphthoquinone diazide moiety. Generally, NQD moieties are preferred to BQD moieties, when diazide groups are used in the practice of the invention. The most preferred diazide moiety for use in the practice of this invention is the 1,2-naphthoquinonediazide moiety.

Preferred means which inhibit dissolution of the infra-red absorbing polymer may include the infra-red absorbing groups themselves. Thus, a preferred infra-red absorbing polymer of the invention comprises functional groups X which act to inhibit the dissolution of the infra-red absorbing polymer compared with the parent polymer, to absorb infra-red radiation and thereby yield heat, and to permit the infra-red absorbing polymer to dissolve in the developer liquid, where thus heated.

Preferred functional groups X, performing all of these functions described in the previous paragraph, are residues of infrared absorbing dyes, preferably polymethine dyes, more preferably cyanine dyes. One definition of a cyanine dye, as disclosed in Hawley's Condensed Chemical Dictionary (12$^{th}$ edition) (Van Nostrand Reinhold 1993), is a dye consisting of two heterocyclic groups connected by a chain of conjugated double bonds containing an odd number of carbon atoms. The definition includes isocyanines, merocyanines, cryptocyanines, phthalocyanines and dicyanines.

The several dissolution inhibition means described herein are not mutually exclusive. One example of a polymer which has two distinct dissolution inhibition means is a polymer having functional groups X as described above and diazide groups.

Preferably, the corresponding polymer without any pendent groups (referred to herein as the "parent polymer") dissolves in the developer liquid. Thus, the infra-red absorbing polymer is preferably insolubilized by means of functional groups thereon.

Preferably the parent polymer has nucleophilic groups Y, able to react with an infra-red absorbing compound, having a halogen atom, for example a chlorine atom. Preferably the parent polymer has groups Y selected from —SO$_2$NHR, —NHR, —SH and —OH, where R represents a hydrogen atom or a $C_{1-4}$ alkyl group, for example a methyl group. Preferably R represents a hydrogen atom. More preferably the parent polymer has sulfonamido groups or hydroxyl groups Y, or both.

Since it is unlikely or undesirable, or both, that all such groups of the parent polymer are functionalized by the reaction, preferably the infra-red absorbing polymer also has such groups Y. Most preferably, the parent polymer has hydroxyl groups Y.

A hydroxyl group-containing polymer may comprise a phenolic resin or co-polymer thereof. Particularly useful phenolic resins in this invention are the condensation products from the interaction between phenol, C-alkyl substituted phenols (such as cresols and p-tert-butyl-phenol), diphenols (such as bisphenol-A) and aldehydes and ketones (such as formaldehyde and acetone). Depending on the preparation route for the condensation a range of phenolic materials with varying structures and properties can be formed, as will be well understood to those skilled in the art. One useful class is pyrogallol/acetone condensates. Particularly useful in this invention are novolak resins, resole resins and novolak/resole resin mixtures. Most preferred are novolak resins. Examples of suitable novolak resins have the following general structure:

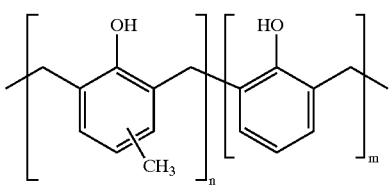

where the ratio of n:m is in the range of 1:20 to 20:1, say 3:1 to 1:3. In one preferred embodiment, n=m. However, in certain embodiments n or m may be zero. Novolak resins suitable for use have a molecular weight in the range of about 500–20,000, preferably in the range of about 1000–15,000, say about 2500–10,000.

Novolak resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols (e.g. bisphenol-A (2,2-bis(4-hydroxyphenyl)propane)), and appropriate aldehydes, for example formaldehyde, chloral, acetaldehyde and furfuraldehyde. As will be well understood by those skilled in the art, the type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is typically used to prepare novolak resins, which are thermoplastic in character. Higher aldehyde:phenol ratios of more then 1:1 to 3:1, and a basic catalyst, give rise to resole resins, and these are characterised by their ability to be thermally hardened at elevated temperatures.

The hydroxyl group-containing polymer may comprise a polyhydroxystyrene resin or co-polymer thereof, of general formula:

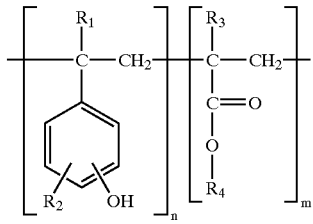

wherein $R_1$ represents a hydrogen atom or alkyl group, $R_2$ represents a hydrogen atom or alkyl group, $R_3$ represents a hydrogen atom or alkyl group, $R_4$ is an alkyl or hydroxyalkyl group, and the ratio n/m is in the range 10/0 to 1/10.

In general terms, any alkyl group is suitably a $C_{1-12}$ alkyl group, preferably a $C_{1-6}$ alkyl group, especially a $C_{1-4}$ alkyl group. An alkyl group may be branched (for example t-butyl) or straight chain (for example n-butyl).

$R_1$ preferably represents a hydrogen atom or a $C_{1-4}$ alkyl group, especially a methyl group. Most preferably $R_1$ represents a hydrogen atom.

$R_2$ preferably represents a hydrogen atom or a $C_{1-4}$ alkyl group, especially a methyl group. Most preferably $R_2$ represents a hydrogen atom.

The hydroxy substituent of the phenyl group shown is preferably located para to the linkage of the phenyl group to the polymer backbone.

$R_3$ preferably represents a hydrogen atom or a $C_{1-4}$ alkyl group, especially a methyl group. Most preferably $R_3$ represents a hydrogen atom.

$R_4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R_4$ are —$CH_3$, —$CH_2CH_2OH$, and —$CH_2CH_2CH_2CH_3$.

Preferably the ratio n/m is in the range 10/1 to 1/10, preferably 5/1 to 1/2. More preferably the ratio n/m is in the range 2/1 to 2/3. Most preferably the ratio n/m is in the range 3/2 to 2/3, especially 1/1.

The weight average molecular weight Mw of the polyhydroxystyrene polymer drawn above, as measured by gel permeation chromatography, is preferably in the range 5,000–75,000, especially 7,000–50,000. The number average molecular weight Mn of the polymer is preferably in the range 2,000–20,000, especially 3,000–8,000.

The infra-red absorbing polymer may be prepared from the parent polymer by reaction between the infra-red absorbing compound, having a reactive halogen atom, and the parent polymer, under standard conditions to promote the required dehydrohalogenation. Typically alkaline dehydrohalogenation will be effective, at an elevated temperature, suitably under reflux. For example, the infra-red absorbing polymer may be prepared by reacting an appropriate parent polymer with a dye having a labile halogen atom, under alkaline conditions at an elevated temperature, to promote dehydrohalogenation. The same method may be used to introduce other pendent groups of the type previously described, in embodiments in which such groups are present.

Preferably the reaction is carried out such that nucleophilic groups Y remain. After reaction the number ratio of remaining nucleophilic groups Y to infra-red absorbing groups X, in the resultant infra-red absorbing polymer, is suitably at least 2:1, preferably at least 5:1, more preferably at least 10:1. Suitably the ratio does not exceed 100:1. Preferably it does not exceed 50:1. Most preferably it does not exceed 40:1.

In accordance with a second embodiment of this invention there is provided a polymer which has functional groups Y independently selected from —$SO_2NHR$, —NHR, —SH and —OH, where R represents a hydrogen atom or a $C_{1-4}$ alkyl group, and additionally pendent groups X which absorb infra-red radiation. Preferred groups Y are as defined above with reference to the first embodiment. Preferred groups X are as defined above with reference to the first embodiment. The number ratio of groups X:Y may be as defined above.

Preferably the polymer of the second embodiment is derived from a parent polymer as defined above, using a method as defined above. It may, if wished, carry further functional groups, as defined herein.

In accordance with a third embodiment of this invention there is provided a process for the preparation of a polymer of the first embodiment, the process and polymer being as defined above.

In accordance with a fourth embodiment of this invention there is provided a thermally imagable composition, comprising a polymer which has pendent infra-red absorbing groups, the composition being such that when carried as a dry coating on a substrate it does not dissolve in a developer liquid, and having the property that in regions subjected to infra-red radiation which is absorbed by the infra-red absorbing groups of the polymer to produce heat, it does then dissolve in the developer liquid.

The polymer may be as defined above with respect to the first or second embodiments of this invention. In preferred embodiments the infra-red absorbing polymer on its own has the property that it does not dissolve in the developer liquid but does dissolve once heated. In other embodiments the infra-red absorbing polymer on its own may or may not have this property to any useful degree, but another compound is present in the composition, and confers this property on the composition, or supplements it, by inhibiting the dissolution of the polymer in the developer liquid. Without wishing to be bound by any one theory, it is believed that a complex forms between such a compound and the infra-red absorbing polymer, the complex being disturbed by heat.

Thus, means which inhibit dissolution of the infra-red absorbing polymer may include a separate dissolution inhibition compound, acting upon and preferably, admixed with, the infra-red absorbing polymer. Suitable dissolution inhibition compounds are described, for example, in EP 825927B, the contents of which are incorporated in this specification by reference.

A useful class of dissolution inhibition compounds are nitrogen containing compounds wherein at least one nitrogen atom is either quarternized or incorporated in a heterocyclic ring, or both quarternized and incorporated in a heterocyclic ring.

Examples of useful quarternized nitrogen containing compounds are triaryl methane dyes, for example Crystal Violet (CI basic violet 3), Victoria Blue and Ethyl Violet, and tetraalkyl ammonium compounds, for example Cetrimide. Preferably a separate dissolution inhibition compound is a nitrogen-containing heterocyclic compound. Examples of suitable nitrogen-containing heterocyclic compounds are quinoline and triazols, such as 1,2,4-triazol. Most preferably a dissolution inhibition compound is a quarternized heterocyclic compound. Examples of suitable quarternized heterocyclic compounds are imidazoline compounds, such as Monazoline C, Monazoline O, Monazoline CY and Monazoline T all of which are manufactured by Mona Industries, quinolinium compounds, such as 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue and 3-ethyl-2-[3-(3-ethyl-2(3H)-benzothiazolylidene)-2-methyl-1-propenyl]benzothiazolium iodide, and the compound of formula:

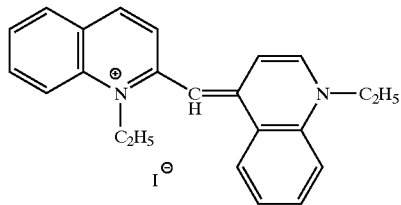

A further useful class of dissolution inhibition compounds are carbonyl functional group containing compounds. Examples of suitable carbonyl containing compounds are -naphthoflavone, -naphthoflavone, 2,3-diphenyl-1-indeneone, flavone, flavanone, xanthone, benzophenone, N-(4-bromobutyl)phthalimide and phenanthrenequinone.

A dissolution inhibition compound may be a compound of general formula:

where $Q_1$ represents an optionally substituted phenyl or alkyl group, q represents 0, 1 or 2, and $Q_2$ represents a halogen atom or any alkoxy group. Preferably $Q_1$ represents a $C_{1-4}$ alkyl phenyl group, for example a tolyl group, or a $C_{1-4}$ alkyl group. Preferably q represents 1 or, especially, 2. Preferably $Q_2$ represents a chlorine atom or a $C_{1-4}$ alkoxy group, especially an ethoxy group.

Another useful dissolution inhibition compound is acridine orange base (CI solvent orange 15). Other useful dissolution inhibition compounds are ferrocenium compounds, such as ferrocenium hexafluorophosphate.

Alternatively or additionally diazide group-containing compounds, admixed with infra-red absorbing polymer, may be employed. Suitably the dissolution inhibitation compound constitutes at least 1%, preferably at least 2%, preferably up to 25%, more preferably up to 15% of the total weight of the composition. Thus a preferred weight range for the dissolution inhibitor compound may be expressed as 2–15% of the total weight of the composition.

In yet other embodiments a cover layer is provided, which acts as a physical barrier preventing the infra-red absorbing polymer from contact with the developer liquid. On exposure to infra-red radiation the heat generated by the infra-red absorbing polymer acts on the cover layer, which no longer acts as a barrier, but allows the developer liquid to contact the underlying infra-red absorbing polymer, in the heated areas.

Thus, the means which act to inhibit the dissolution of the composition of the fourth embodiment of this invention may include functional groups carried by the infra-red absorbing polymer itself, for insolubilizing the infra-red absorbing polymer, as described above, and separate insolubilizer means, useful when the infra-red absorbing polymer does not itself have this capability (or even when it does, as an additional measure).

In accordance with a fifth embodiment of this invention there is provided a lithographic printing form precursor which comprises a thermally imagable coating on a substrate, the coating comprising a composition of the fourth embodiment.

Preferably, the composition applied to the lithographic printing form precursor of the fifth embodiment comprises an infra-red absorbing polymer of the first embodiment defined above. Thus, in preferred embodiments the infra-red absorbing polymer itself has the required dissolution characteristics, without need of any separate solubility inhibition compound, whether provided as a protective layer or admixed with the infra-red absorbing polymer.

In accordance with a sixth embodiment of this invention there is provided a method of producing a lithographic printing form from a lithographic printing form precursor of the fifth embodiment of this invention, the method comprising an exposure step of imagewise exposing areas of the composition to infra-red radiation of wavelength which is absorbed by the infra-red absorbing groups of the polymer to produce heat, followed by a developer step of contacting the precursor with a developer liquid, to remove the exposed areas of the composition.

In accordance with a seventh embodiment of this invention there is provided a lithographic printing form prepared by the method of the sixth embodiment.

The coating is preferably such that incident UV radiation does not increase its dissolution rate in a developer liquid. The coating is preferably such that on thermal imaging it does not undergo an irreversible chemical change. Without wishing to be bound by any one theory, it is believed that preferred coatings are those in which a complex is merely disrupted by heat (i.e. not ones in which an irreversible photochemical change takes place).

The infra-red absorbing groups are preferably such that in exposure methods the polymer may be exposed by means of electromagnetic radiation of wavelength above 600 nm, and especially above 700 nm. Suitably it can be exposed by radiation of wavelength below 1400 nm, preferably below 1200 nm. Preferably it may not be exposed in any practicable manner outside these ranges. In a particularly preferred embodiment, the infra-red absorbing groups employed in the polymer of this invention have an electromagnetic radiation absorption maximum in the range of about 700 nm to about 1200 nm. The intensity of the infra-red radiation used in this invention will be understood by those skilled in the art to be the intensity necessary to cause the infra-red absorbing groups of the polymer to generate heat upon exposure to the infra-red radiation. Preferably, the intensity of the infra-red radiation is at least about 0.01 mW/$\mu$m$^2$, more preferably at least 0.1 mW/$\mu$m$^2$. It will be understood by those skilled in the art that the intensity may be greater than these minimum values, so long as the intensity is below the level capable of causing ablation of the coating applied to the substrate as discussed above.

Preferably, the method of the sixth embodiment of the invention employs a laser for the exposure step. Examples of lasers which can be used include semiconductor diode lasers emitting at between 600 nm and 1400 nm, especially between 700 nm and 1200 nm. Examples are the Nd YAG laser which emits at 1064 nm and the diode laser imagesetter sold by Creo under the trade mark TRENDSETTER, which emits at 830 nm, but any laser of sufficient imaging power and whose radiation is absorbed by the composition may be used.

Preferably the infra-red absorbing groups have an absorption spectrum such that absorption is significant at the wavelength output of the radiation source, preferably laser, which is to be used in the patternwise exposure of precursors of the present invention.

In preferred coatings it is preferred that their dissolution rate in a developer is not increased by incident UV or visible radiation, thus making handling of the compositions straightforward. Preferably such coatings do not comprise any UV or visible light sensitive components. However UV or visible light sensitive components which are not activated by UV or visible light due to the presence of other components, such as UV or visible light absorbing dyes or a UV or visible light-absorbing topmost layer, may in principle be present in such coatings.

The compositions of the fourth embodiment of this invention may additionally contain other ingredients such as polymeric particles, stabilizing additives, pigments and additional inert polymeric binders as are well known to be present in many positive working compositions.

A printing form precursor of the fifth embodiment includes a substrate over which the coating is provided. The substrate may be arranged to be non-ink-accepting. The substrate may have a hydrophilic surface for use in conventional lithographic printing using a fount solution or the substrate may have a release surface suitable for use in waterless printing.

The substrate may comprise a metal layer. Preferred metals include aluminum, zinc and titanium, with aluminum being especially preferred. The substrate may comprise an alloy of the above-described metals. Other alloys that may be used include brass and steel, for example stainless steel. The substrate may comprise a non-metal layer. Preferred non-metal layers include layers of plastics, paper or the like. Preferred plastics include polyester, especially polyethylene terephthalate. The substrate may be any type of substrate usable in printing. For example, the substrate may comprise a cylinder or, preferably, a plate.

The substrate may be an aluminum plate which has undergone the usual anodic, graining and post-anodic treatments well known in the lithographic art for enabling a radiation sensitive composition to be coated thereon and for the surface of the support to function as a printing background. Another substrate which may be used in the present invention in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated can be used.

As will be well understood by those skilled in the art, when it is stated herein that a coating dissolves it is meant that the coating dissolves in a selected developer, to an extent useful in a lithographic printing form development process. When it is stated herein that the coating does not dissolve it is meant that the coating does not dissolve in the selected developer, to an extent useful in a lithographic printing form development process. When it is stated that the coating's dissolution rate is not increased by incident UV or visible radiation, it is meant that it is not substantially increased, that is, by an amount which would mean that in a normal printshop environment UV/visible safelighting would have to be employed. Thus, insubstantial increases in dissolution rate caused by UV or visible radiation, causing no significant effect on operation, or increases caused by artificially high levels of UV or visible radiation, which do not reflect printshop handling conditions, do not fall within the terms of this definition.

Thus in preferred embodiments of this invention a lithographic printing form may be obtained after patternwise exposure and development of a positive working precursor of the fourth embodiment. The dissolution rate of the coating in the developer liquid after it has been subjected to heat during patternwise exposure by means of infra-red radiation is greater than the dissolution rate of the corresponding unexposed coating. Thus in the exposed areas the coating is preferentially dissolved, to form the pattern.

As will be well understood by those skilled in the art, the developer liquid is dependent on the nature of the polymeric substance, but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer, suitably containing an organic or, preferably, an inorganic metasilicate, for example sodium metasilicate.

Preferred precursors of the invention are exclusively positive working. That is, they have no additional negative working capability.

A printing form of the seventh embodiment may be heated after development, to increase its run length on a printing press.

The following examples more particularly serve to illustrate various embodiments of the present invention described hereinabove.

EXAMPLES

1. Starting Materials

The following products are referred to herein:

LB 6564—a phenol/cresol novolak resin supplied by Bakelite AG, Germany.

Cyclorubber—a cyclised rubber incorporating phenol, supplied by Freundorfer, Munich, Germany.

Maruka Lyncur M—a polyvinylphenol manufactured by Maruzen, Japan, and also available from Siber Hegner, Beckenham, UK.

Maruka Lyncur CHM—a copolymer of polyvinylphenol and hydroxyethylmethacrylate, having the structure:

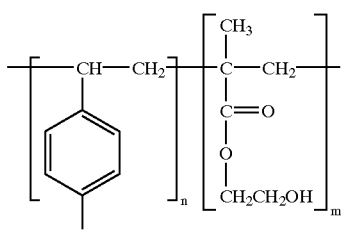

n/m = 1/1, Mw = 7,000–14,000
Mn = 3,000–5,500 available from Siber Hegner.

PD 140A—Durite PD 140A, a cresylic resin, 75% meta, 25% para, Mw=7000, available from Borden Chemicals, Southampton, UK.

LA 751—a resole resin available from Bakelite.

LA 6823—a resole resin available from Bakelite.

Cellobond J 1002 G—a phenol formaldehyde polymer available from Blagden Chemicals of Sully, Glamorgan, UK.

LB 744—a cresol novolac resin supplied by Bakelite.

Maruka Lyncur CBA—a copolymer of polyvinylphenol and butylacrylate having the structure:

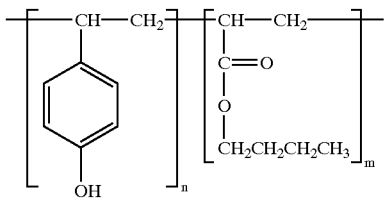

n/m = 8/2–6/4, Mw = 10,000–30,000
Mn = 5,000–5,500 available from Siber Hegner Ltd.

Aldrich PMMA—a poly(methylmethacrylate) polymer, Mw=15000, available from Aldrich, UK.

IR Dye A—a dye having the structure:

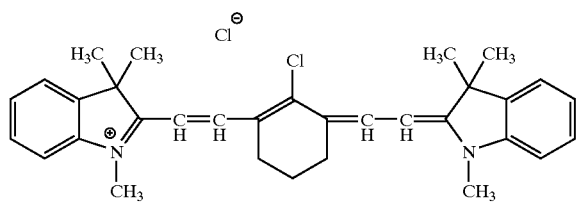

This was prepared in-house but a dye having the same chromophore (but with a bromide anion) is available from Riedel de Haan UK, Middlesex, UK, under the name KF 654 B/PINA.

IR Dye B—a dye having the structure:

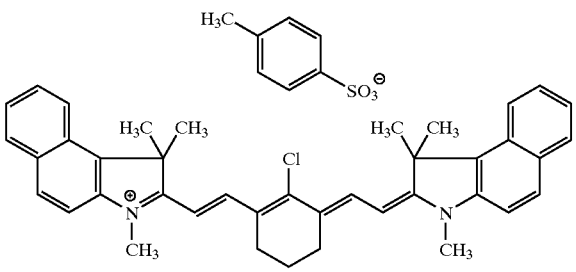

IR dye D—a dye available from FEW (Germany) having the structure:

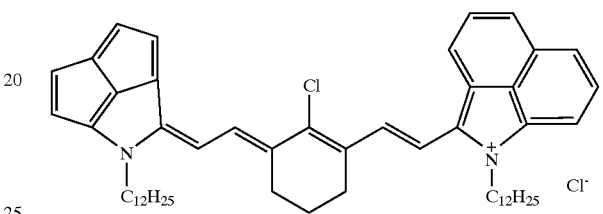

Oxonol 595—an oxonol dye available from Aldrich, UK.

Byk 307—a modified siloxane surfactant available from Byk Chemie, Wesel, Germany.

Developer A: 14% wt sodium metasilicate pentahydrate in water.

Creo TRENDSETTER 3244—a commercially available plate setter, operating at a wavelength of 830 nm, as supplied by Creo Products of Burnaby, Canada.

Mathis labdryer oven—a drying oven available from Werner Mathis AG, Germany.

2. Polymer Modification

EXAMPLE 1

A solution of 126 parts of Bakelite LB 6564 phenolic resin in 300 parts ethanol was treated with 2.1 parts of solid sodium hydroxide followed by 26 parts of IR Dye A (all parts by weight). The mixture was heated to boiling under reflux for 30 minutes. A resin with about 4.5 mole percent loading of dye chromophore was then isolated by precipitation into water and drying under vacuum.

EXAMPLE 2 (COMPARATIVE)

The Bakelite resin LB 6564 and IR dye A were mixed as in Example 1 but without sodium hydroxide. The solution was stirred for 5 minutes without heating, then was precipitated into water. The precipitate was collected by filtration and dried.

The materials from Examples 1 and 2 are compared in Table 1. $\lambda_{max}$ is the wavelength at which the absorbency of electromagnetic radiation is at a maximum.

TABLE 1

| Example | 1 | 2 |
| --- | --- | --- |
| Filtration behaviour | Very fast | Very slow |
| Color of filtrate | Colorless | Dark green |

TABLE 1-continued

| Example | 1 | 2 |
|---|---|---|
| Appearance of product | Green powder | Green chunks |
| $\lambda_{max}$ in MeOH | 768 nm | 773 nm |

From the comparison of the properties of the two materials in Table 1 it was concluded that in Example 1 the dye has reacted with the phenolic resin to make a new material completely distinct from the simple mixture of the two starting materials. The absorption maximum isolated in Example 2 is very similar to that of IR Dye A itself, whereas the shift in the absorption maximum of the product from Example 1 indicates that the IR dye chromophore has been altered as a result of reaction with the phenolic resin.

Other infra-red absorbing polymers prepared by procedures similar to those outlined in Example 1 are listed in Table 2. Solvents used for $\lambda_{max}$ assessment were methanol (MeOH), 1-methoxy-2-propanol (DPM), dimethyl formamide (DMF) and toluene.

| Example | Starting polymer | Polymer amount | Starting Dye | Dye amount | $\lambda_{max}$ (solvent) | $\epsilon$ (Lg$^{-1}$cm$^{-1}$) |
|---|---|---|---|---|---|---|
| 3 | Cyclorubber | 30 g | IR Dye A | 5.2 g | 765 nm (toluene) | 13.1 |
| 4 | Maruka Lyncur M | 120 g | IR Dye A | 26 g | 765 nm (MeOH) | 65.9 |
| 5 | Maruka Lyncur CHM | 125 g | IR Dye A | 26 g | 764 nm (MeOH) | 74.9 |
| 6 | LB 6564 | 456 g | IR Dye A | 104 g | 768 nm (MeOH) | 74.7 |
| 7 | LB 6564 | 100 g | IR Dye A | 14.2 g | 765 nm (DPM) | 50.8 |
| 8 | LB 6564 | 100 g | IR Dye A | 7.0 g | 769 nm (MeOH) | 27.7 |
| 9 | PD 140A | 240 g | IR Dye A | 15.6 g | 768 nm (MeOH) | 28.9 |
| 10 | LB 6564 | 60 g | IR Dye A | 52.0 g | 773 nm (DMF) | 115.8 |
| 11 | LA 751 | 136 g | IR Dye A | 15.7 | 769 nm (DPM) | 33.6 |
| 12 | LA 6823 | 110 g | IR Dye A | 15.7 g | 765 nm (MeOH) | 65.2 |
| 13 | Cellobond J 1002 F | 150 g | IR Dye A | 3.9 g | 770 nm (MeOH) | 19.2 |
| 14 | Cellobond J 1002 | 150 g | IR Dye A | 7.8 g | 769 nm (MeOH) | 29.8 |
| 15 | LB 744 | 120 g | IR Dye A | 7.8 g | 769 nm (MeOH) | 33.9 |
| 16 | LB 744 | 120 g | IR Dye A | 22.7 g | 755 nm (DPM) | 54.7 |
| 17 | LB 6564 | 100 g | IR Dye B | 20.6 g | 813 nm (DPM) | 51.2 |
| 18 | LB 6564 | 100 g | IR Dye B | 10.3 g | 811 nm (MeOH) | 30.6 |
| 19 | PD 140 A | 120 g | IR Dye B | 11.4 g | 810 nm (MeOH) | 25.8 |
| 20 | PD 140 A | 60 g | IR Dye B | 75.5 g | 810 nm (DMF) | 120.9 |
| 21 | Maruka Lyncur M | 120 g | IR Dye B | 37.8 g | 806 nm (MeOH) | 63.9 |
| 22 | Maruka Lyncur CBA | 121 g | IR Dye B | 37.8 g | 803 nm (MeOH) | 64.1 |
| 23 | LA 751 | 136 g | IR Dye B | 22.7 g | 808 nm (DPM) | 32.9 |
| 24 | LS 6823 | 110 g | IR Dye B | 22.7 g | 804 nm (MeOH) | 60.7 |
| 25 | LB 6564 | 120 g | IR Dye B | 22.7 g | 807 nm (MeOH) | 49.6 |
| 26 | LB 6564 | 120 g | IR Dye B | 30.2 g | 814 nm (DPM) | 67.0 |
| 27 | Cellobond J 1002 F | 150 g | IR Dye B | 5.7 g | 810 nm (MeOH) | 22.2 |
| 28 | Cellobond J 1002 F | 150 g | IR Dye B | 11.3 g | 808 nm (MeOH) | 30.1 |
| 29 | LB 744 | 120 G | IR Dye B | 11.3 g | 809 nm (MeOH) | 36.9 |
| 30 | LB 744 | 120 g | IR Dye B | 22.7 g | 807 nm (MeOH) | 55.1 |
| 31 | LB 6564 | 11 g | IR Dye D | 0.84 g | 1015 nm (MeOH) | 11.0 |
| 32 | LB 6564 | 22 g | IR Dye D | 5.1 g | 1013 nm (MeOH) | 24.6 |

In the above table, ε denotes the extinction coefficient, and can be viewed as the intensity of the absorption peak $\lambda_{max}$.

EXAMPLE 33

A coating solution was formulated by dissolving 6.75 parts of an infra-red absorbing polymer (prepared as described in Example 1 but with about 1.5 mole percent dye chromophore), 0.12 parts of Oxonol 595 and 0.01 parts of Byk 307 in a mixture of 13.97 parts acetone and 79.15 parts 1-methoxy-2-propanol (weight/weight). The solution was whirl-coated onto a grained and anodized aluminum substrate prepared as described in U.S. Pat. No. 5,368,974 (which is incorporated herein by reference) and dried at 100° C. The resulting plate was imaged on a Creo 3244 Trendsetter at a laser power setting of 11 W and a drum speed of 93 rpm. The plate was immersed in Developer A for 40 seconds and then rinsed with water. Measurements of the reflective density of the plate revealed that the unexposed coating lost on 10% of its thickness, while the coating was completely removed by the developer in the imaged areas. Extending the development time to 80 seconds resulted in only about a 20% loss in unexposed coating thickness. A plate was similarly prepared and mounted on an A. B. Dick press to produce 500 copies.

EXAMPLE 34 (COMPARATIVE)

A coating solution was formulated by dissolving 6.30 parts of LB 6564, 0.76 parts of IR Dye B, 0.12 parts of Oxonol 595, 0.01 parts of Byk 307, 13.92 parts of acetone and 78.89 parts of 1-methoxy-2-propanol (weight/weight). The solution was used to prepare a plate as described in Example 33. The resulting coating has approximately the same proportion of IR dye to phenolic resin as in Example 31, except that the IR dye was not covalently bonded to the phenolic resin. The plate was imaged and processed as described in Example 33. Measurements of the reflective density of the plate revealed that the unexposed coating lost 10% of its thickness after only 10 seconds immersion in Developer A and that extending the development time to 20 seconds results in almost 90% loss of coating thickness.

EXAMPLE 35

A coating solution was formulated by dissolving 3.53 parts of the phenolic resin of Example 7, 3.53 parts of LB 6564 resin, 0.13 parts of Oxonol 595 and 0.01 parts of Byk 307 in a mixture of 13.92 parts of acetone and 78.89 parts of 1-methoxy-2-propanol (weight/weight). The solution was used to prepare and image a plate as described in Example 33. After 10 seconds immersion in Developer A the imaged areas of the coating were completely removed, while the degree of unexposed coating loss was only 3–4%.

EXAMPLE 36

A coating solution was prepared by dissolving 6.76 parts of the infra-red absorbing polymer of Example 1 in 14 parts acetone and 79.24 parts 1-methoxy-2-propanol (weight/weight). The solution was used to prepare a printing form precursor as described in Example 33. The precursor was imaged on a Creo 3244 Trendsetter at a laser power setting of 6 W and a drum speed of 120 rpm. The plate was developed with Developer A to remove the exposed areas. The resulting plate was mounted on an A. B. Dick press and used to print 500 copies that reproduced 1% highlight dots and showed no evidence of background tinting.

EXAMPLES 37–40

The infra-red absorbing polymer drawn below was prepared. First, the method described for Example 1 was used to introduce the infra-red absorbing groups. The resulting resin was then cooled and reacted with 2-diazo-1-naphthol-4-sulfonyl chloride under standard conditions, employing cooling and in the presence of a base. The resulting infra-red and ultra-violet absorbing polymer is described in the table below as "derivatized LB 6564".

The resulting polymer is believed to have the structure:

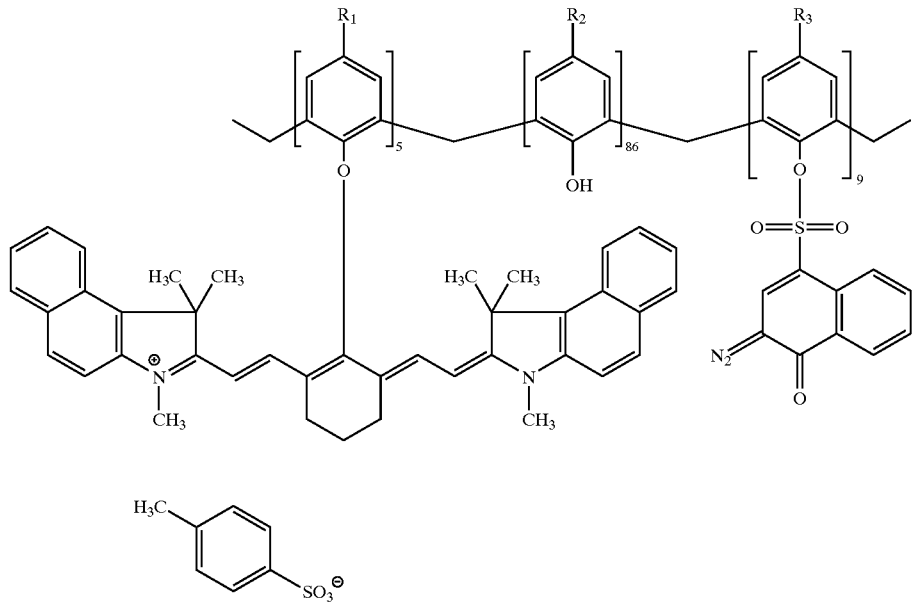

where $R_1$, $R_2$ and $R_3$ are each independently H or $CH_3$.

Coating formulations of the compositions below were prepared in 1-methoxypropan-2-ol. The substrate used was 0.3 mm sheets of aluminum that had been electrograined, anodised and given a post-anodic treatment with a phosphate. The coating solutions were coated onto the substrate by means of a wire wound bar. The coating solution concentrations were selected to give the specified dry film compositions with a coating weight of about 2.0 gm$^{-2}$ after drying at 110° C. for 90 seconds in a Mathis Labdryer oven.

These coatings are referred to as Examples A and B.

| Components | Example 37 | Example 38 |
|---|---|---|
| Derivatized LB6564 | 90 | 80 |
| LB 6564 | 10 | 20 |

Compositions are quoted as the percentage of the dry coating.

A sample of each of these coated compositions was then over-coated, using a wire wound bar, with a solution of Aldrich PMMA polymer in toluene. The concentration was selected to give the specified dry film weight of around 0.3 gm$^{-2}$ on drying at 110° C. for 60 seconds in the Mathis Labdryer oven. These samples are referred to as Examples 39 and 40.

Plates to be imaged were cut into discs of 105 mm diameter and placed on a rotatable disc that could be rotated at a constant speed (between 100 and 2500 rpm) Adjacent to the rotatable disc, a translating table held a laser beam source so that it impinged normal to the disc, while the translating table moved the laser beam radially in a linear fashion with respect to the rotatable disc. The exposed image was in the form of a spiral whereby the image in the center of the spiral represented slow laser scanning speed and long exposure time and the outer edge of the spiral represented fast scanning speed and short exposure time.

The laser used was a single mode 830 nm wavelength 200 mW laser diode, which was focused to a 10 micron spot. The laser power supply was a stabilized constant current source.

The imaged discs were developed using Developer A at 220° C. for 90 seconds for the single-layer Examples 37 and 38 and 120 seconds for the two-layer Examples 39 and 40.

The minimum imaging speed of the coatings were determined using an Olympus BX60F-3 microscope to locate the point along the spiral where the imaged track started to become broken by coating, and measuring the radial distance from the center of the spiral (mm) and the track width (microns) at this point. These values along with the rotation speed of the disc on the imaging device were used to calculate the corresponding imaging energies in mJ/cm$^2$.

The values are displayed in the table below.

| Rotation Example | Speed (rpm) | Radial Distance | Track Width | Imaging Energy |
|---|---|---|---|---|
| 37 | 750 | 46 | 10 | 106 |
| 38 | 750 | 48 | 12 | 102 |
| 39 | 500 | 29 | 6 | 253 |
| 40 | 500 | 34 | 5 | 215 |

These show that all the compositions were imagable with an IR laser and that the provision of the thin second layer used in Examples 39 and 40 meant that those examples required about double the energy to image, compared with the single layer Examples 37 and 38.

The invention claimed is:

1. A polymer comprising at least one pendent infra-red absorbing group having an electromagnetic radiation absorption maximum in the range of about 700 nm to about 1200 nm, wherein the polymer does not dissolve in a developer liquid, with the proviso that when subjected to infra-red radiation, the polymer dissolves in the developer liquid.

2. The polymer of claim 1, wherein the polymer additionally comprises further pendent groups which inhibit the dissolution of the non-irradiated polymer in the developer liquid.

3. A polymer comprising at least one pendent infra-red absorbing group and further pendent groups comprising o-quinonediazide groups which inhibit the dissolution of the non-irradiated polymer in a developer liquid, wherein the polymer does not dissolve in the developer liquid, with the proviso that when subjected to infra-red radiation, the polymer dissolves in the developer liquid.

4. The polymer of claim 1, wherein the infra-red absorbing groups themselves inhibit the dissolution of the polymer in the developer liquid.

5. The polymer of claim 1, wherein the polymer has at least one group selected from —SO$_2$NHR, —NHR, —SH and —OH, where R represents a hydrogen atom or a C$_{1-4}$ alkyl group.

6. The polymer of claim 5, comprising hydroxyl groups.

7. The polymer of claim 1, which is substantially insensitive to radiation of wavelength below 600 nm.

8. The polymer of claim 1, wherein the infra-red absorbing groups are residues of polymethine dyes or cyanine dyes.

9. A polymer comprising (i) at least one functional group independently selected from —SO2NHR, —NHR, —SH and —OH, where R represents a hydrogen atom or a C1–4 alkyl group; and (ii) at least one pendent group which absorbs infra-red radiation in the range of about 700 nm to about 1200 nm.

10. A thermally imagable composition comprising a polymer which comprises at least one pendent infra-red absorbing group, with the proviso that when the composition is carried as a dry coating on a substrate that the composition does not dissolve in a developer liquid, and the composition dissolves in the developer liquid upon being subjected to infra-red radiation.

11. The composition of claim 10, wherein the composition further comprises at least one additional component which inhibits the dissolution of the composition in the developer liquid.

12. The composition of claim 10, wherein the polymer is resistant to dissolution in the developer liquid.

13. A lithographic printing form precursor which comprises: (i) a substrate; and (ii) a thermally imageable coating on the substrate, wherein the coating comprises a thermally imageable composition which comprises a polymer which comprises at least one pendent infra-red absorbing group, with the proviso that when the composition is carried as a dry coating on the substrate the composition does not dissolve in a developer liquid, and the composition dissolves in the developer liquid upon being subjected to infra-red radiation.

14. The precursor of claim 13, wherein a cover layer of a material is provided over the composition, such that where the cover layer has not been subjected to infra-red radiation the cover layer screens the underlying composition from contact with the developer liquid, and where the cover layer has been subjected to the infra-red radiation the cover layer permits the developer liquid to contact and dissolve the underlying composition.

15. A thermally imagable composition comprising a polymer which comprises at least one pendent infra-red absorbing group, with the proviso that when the composition is carried as a dry coating on a substrate that the composition has a first dissolution rate in a developer liquid prior to exposure to infra-red radiation, and a second dissolution rate in the developer liquid after exposure to infra-red radiation, wherein the second dissolution rate is greater than the first dissolution rate.

16. A lithographic printing form precursor which comprises: (i) a substrate; and (ii) a thermally imageable coating on the substrate, wherein the coating comprises a thermally imageable composition which comprises a polymer which comprises at least one pendent infra-red absorbing group, with the proviso that when the composition is carried as a dry coating on the substrate the composition has a first dissolution rate prior to exposure to infra-red radiation in a developer liquid, and a second dissolution rate in the developer liquid after exposure to infra-red radiation, wherein the second dissolution rate is greater than the first dissolution rate.

17. A polymer comprising at least one pendent infra-red absorbing group and further pendent groups which inhibit the dissolution of the non-irradiated polymer in a developer liquid, wherein the polymer does not dissolve in the developer liquid, with the proviso that when subjected to infra-red radiation, the polymer dissolves in the developer liquid.

18. A polymer prepared by a process comprising: (a) providing a parent polymer comprising a phenolic resin; and (b) reacting the parent polymer with an infra-red absorbing compound having a reactive halogen atom, such that the resulting polymer comprises at least one pendent infra-red absorbing group, wherein the resulting polymer does not dissolve in a developer liquid, but upon being subjected to infra-red radiation, the resulting polymer dissolves in the developer liquid.

19. The polymer of claim 18, wherein the phenolic resin is the condensation product from the interaction between compounds selected from the group consists of phenols, C-alkyl substituted phenols, diphenols, aldehydes and ketones.

20. The polymer of claim 18, wherein the pheonolic resin is selected from the group consisting of novolak resins, resole resins and novolak/resole resin mixtures.

21. The polymer of claim 18, wherein the phenolic resin is a polyhydroxystyrene resin or a copolymer thereof.

22. The polymer of claim 21, wherein the polyhydroxystyrene resin or copolymer thereof has the general formula:

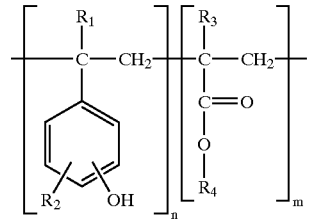

wherein $R_1$ represents a hydrogen atom or alkyl group, $R_2$ represents a hydrogen atom or alkyl group, $R_3$ represents a hydrogen atom or alkyl group, $R_4$ is an alkyl or hydroxyalkyl group, and the ratio n/m is in the range 10/0 to 1/10.

23. The polymer of claim 17, wherein the pendent groups which inhibit the dissolution of the non-irradiated polymer in a developer liquid are selected from the group consisting of —O—SO$_2$—tolyl, —O—dansyl, O—SO$_2$—thienyl, —O—SO$_2$—naphthyl and —O—CO—Ph.

24. A lithographic printing form precursor which comprises: (i) a substrate; and (ii) a thermally imageable coating on the substrate, wherein the coating comprises a thermally imageable composition which comprises a polymer which comprises at least one pendent infra-red absorbing group, with the proviso that when the composition is carried as a dry coating on the substrate the composition is not removable by a developer liquid, and the composition is removable by the developer liquid upon being subjected to infra-red radiation.

* * * * *